United States Patent
Kishi

(10) Patent No.: US 8,174,331 B2
(45) Date of Patent: May 8, 2012

(54) TEMPERATURE COMPENSATED CRYSTAL OSCILLATOR, PRINTED-CIRCUIT BOARD, AND ELECTRONIC DEVICE

(75) Inventor: Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/728,334

(22) Filed: Mar. 22, 2010

(65) Prior Publication Data

US 2010/0271146 A1  Oct. 28, 2010

(30) Foreign Application Priority Data

Apr. 22, 2009 (JP) ................................ 2009-104326

(51) Int. Cl.
*H03B 5/32* (2006.01)
(52) U.S. Cl. ......... 331/158; 331/176; 310/315; 310/346
(58) Field of Classification Search .............. 331/116 R, 331/116 FE, 158, 163, 66, 176; 310/315, 310/346
See application file for complete search history.

(56) References Cited

U.S. PATENT DOCUMENTS

| | | | |
|---|---|---|---|
| 3,818,254 A | 6/1974 | Persson | |
| 4,259,606 A | 3/1981 | Vig | |
| 4,748,367 A | 5/1988 | Bloch et al. | |
| 4,949,055 A | 8/1990 | Leitl | |
| 5,041,800 A | 8/1991 | Long et al. | |
| 5,359,285 A * | 10/1994 | Hashinaga et al. ...... | 324/750.07 |
| 5,955,825 A * | 9/1999 | Uno .............................. | 310/360 |
| 7,674,038 B2 | 3/2010 | Heine et al. | |
| 2008/0061899 A1 | 3/2008 | Stolpman | |
| 2008/0297268 A1 | 12/2008 | Matsui et al. | |

FOREIGN PATENT DOCUMENTS

| | | |
|---|---|---|
| DE | 3629588 A1 | 3/1988 |
| DE | 10065723 A1 | 7/2002 |
| JP | 2008-300978 A | 12/2008 |

OTHER PUBLICATIONS

European Search Report dated Aug. 2, 2010, issued in corresponding European Patent Application No. 10157416.

* cited by examiner

*Primary Examiner* — Ryan Johnson
(74) *Attorney, Agent, or Firm* — Westerman, Hattori, Daniels & Adrian, LLP

(57) ABSTRACT

A temperature compensated crystal oscillator includes an oscillation circuit including a crystal oscillator; a variable capacitor inserted in series in the oscillation circuit; a thermosensitive circuit element whose resistance value changes in accordance with a temperature of the crystal oscillator, the thermosensitive circuit element being formed on the crystal oscillator by vapor deposition; and a correction circuit configured to correct capacitance of the variable capacitor based on a current value that is used when applying current to the thermosensitive circuit element.

4 Claims, 11 Drawing Sheets

TEMPERATURE COMPENSATED CRYSTAL OSCILLATOR, PRINTED-CIRCUIT BOARD, AND ELECTRONIC DEVICE

CROSS-REFERENCE TO RELATED APPLICATIONS

This patent application is based upon and claims the benefit of priority of the prior Japanese Patent Application No. 2009-104326 filed on Apr. 22, 2009, the entire contents of which are incorporated herein by reference.

FIELD

The embodiments discussed herein are related to a temperature compensated crystal oscillator.

BACKGROUND

A temperature compensated crystal oscillator (TCXO: Temperature Compensated Xtal Oscillator) is used in various electronic devices, such as a communication device and an information device.

FIG. 1 is a cross-sectional view of a structure of a conventional temperature compensated crystal oscillator. The conventional temperature compensated crystal oscillator includes a crystal oscillator 2 and an IC (Integrated Circuit) 3 that are disposed inside a casing 1. As illustrated in FIG. 1, the crystal oscillator 2 includes a crystal piece 21 and two (a pair of) excitation electrodes 22, 23 that are connected to the crystal piece 21.

The casing 1 has a lid 1A, and is made of ceramics. The casing 1 is hermetically sealed and filled with dry nitrogen, with the crystal oscillator 2 and the IC 3 disposed inside. The casing 1 is disposed on a circuit board 5.

The crystal piece 21 of the crystal oscillator 2 is connected to an inner wall 1B of the casing 1, such that the crystal piece 21 is located at a substantially center position of the internal space of the casing 1. The crystal piece 21 is an AT-cut quartz crystal having a particular thickness for attaining a target unique oscillation frequency. The excitation electrodes 22, 23 are formed on the crystal piece 21. The excitation electrodes 22, 23 are film electrodes made of gold (Au).

The IC 3 is disposed at the bottom of the internal space of the casing 1.

A temperature sensor 4 is disposed inside or on top of the IC 3. The temperature sensor 4 is a thermosensor whose resistance value changes according to the temperature of the IC 3. For example, a nichrome wire may be used as the temperature sensor 4. The resistance value of the temperature sensor 4 changes according to the temperature of the IC 3, and therefore the temperature sensor 4 outputs an electric current corresponding to the temperature of the IC 3.

FIG. 2 illustrates a circuit of the conventional temperature compensated crystal oscillator illustrated in FIG. 1.

The IC 3 includes a variable capacitor 31, an inverter 32, an output buffer circuit 33, a correction circuit 34, and a memory 35.

The variable capacitor 31 and the inverter 32 are connected to the excitation electrodes 22, 23 of the crystal oscillator 2, thereby forming a loop-type oscillation circuit including the crystal oscillator 2.

The output buffer circuit 33 converts oscillation signals obtained by the oscillation circuit into clock signals, and outputs the clock signals. In practical situations, the output buffer circuit 33 may have plural inverters; however, as a matter of convenience, only one inverter is illustrated in FIG. 2.

The variable capacitor 31 is a variable capacitance element whose electrostatic capacitance is variable. The variable capacitor 31 is inserted in series in the oscillation circuit, so that the electrostatic capacitance of the loop-type oscillation circuit may be varied. The variable capacitor 31 is formed with a variable diode such as a varicap diode. The electrostatic capacitance of the variable capacitor 31 may be varied according to the voltage applied from the correction circuit 34.

The memory 35 is built in the IC 3, and stores data expressing inverse properties of the frequency temperature properties of the crystal oscillator 2. The memory 35 is used by the correction circuit 34 for converting the current values expressing temperature signals into voltage values applied to the variable capacitor 31. The correction circuit 34 refers to the memory 35, and applies, to the variable capacitor 31, a voltage corresponding to the temperature signal (current value) expressing the temperature detected by the temperature sensor 4. For example, the correction circuit 34 has a circuit configuration as described in Japanese Laid-Open Patent Application No. 2008-300978 (see FIG. 3).

According to the configuration described above, when the temperature detected by the temperature sensor 4 changes, the electrostatic capacitance of the variable capacitor 31 is adjusted. Therefore, the oscillation frequency is stabilized with respect to temperature changes.

Clock signals output from the output buffer circuit 33 of the above-described temperature compensated crystal oscillator are used in a CPU (Central Processing Unit) or a communications unit of an electronic device.

As electronic devices are becoming miniaturized, electronic devices including temperature compensated crystal oscillators are becoming increasingly densified. For example, limited space is available in mobile phones and car navigation systems, and therefore such electronic devices are highly densified.

In manufacturing such a highly-densified electronic device, there is limited freedom in designing the internal structure of the electronic device.

An electronic device is typically provided with an electronic component that functions as a high-temperature heat source, such as the transmission amplifier of a mobile phone. This electronic component is mounted on a printed-circuit board together with a temperature compensated crystal oscillator. Thus, it is difficult to change the arrangement of electronic components in an attempt to reduce the amount of heat transferred from the heat source to the temperature compensated crystal oscillator.

Although the freedom in designing electronic devices is limited, electronic devices are becoming increasingly high-performance, and therefore there is growing demand for high-precision temperature compensated crystal oscillators.

Accordingly, there is growing demand for temperature compensated crystal oscillators capable of compensating the oscillation frequency with high precision, even in an environment with variable temperature.

However, in the above-described conventional temperature compensated crystal oscillator, the temperature sensor 4 is attached to the IC 3 that is spaced away from the crystal piece 21. The IC 3 is closer to a heat source mounted on the printed-circuit board, than is the crystal piece 21. Hence, there are cases where the temperature measured by the temperature sensor 4 is different from the actual temperature of the crystal piece 21, due to a delay in the heat transfer. Such a temperature difference caused by the delay in the heat transfer tends to increase when the temperature of the heat source rises rapidly.

Furthermore, the temperature difference attributed to the delay in the heat transfer may cause an error in the operation of compensating for the variation in the oscillation frequency. Accordingly, the variation in the oscillation frequency may not be appropriately compensated.

Another example of the conventional technology is a discrete type temperature compensated crystal oscillator, in which the correction circuit or the memory is provided separately from the IC. In this case also, the temperature sensor is spaced away from the crystal oscillator, and therefore a temperature difference is caused by the delay in the heat transfer, similar to the case of the temperature compensated crystal oscillator in which the correction circuit and the memory are provided together in the IC. Accordingly, the variation in the oscillation frequency may not be appropriately compensated.

In order to reduce the errors in the control operation caused by the delay in the heat transfer, a temperature sensor such as a nichrome wire may be directly attached to the crystal oscillator. However, the mass and the position of the excitation electrodes of the crystal oscillator are determined for attaining a target oscillation frequency. Thus, it is difficult to directly attach a temperature sensor such as nichrome wire to the crystal oscillator.

SUMMARY

According to an aspect of the invention, a temperature compensated crystal oscillator includes an oscillation circuit including a crystal oscillator; a variable capacitor inserted in series in the oscillation circuit; a thermosensitive circuit element whose resistance value changes in accordance with a temperature of the crystal oscillator, the thermosensitive circuit element being formed on the crystal oscillator by vapor deposition; and a correction circuit configured to correct capacitance of the variable capacitor based on a current value that is used when applying current to the thermosensitive circuit element.

The object and advantages of the invention will be realized and attained by means of the elements and combinations particularly pointed out in the appended claims. It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings.

[a] First Embodiment

Figure 3:
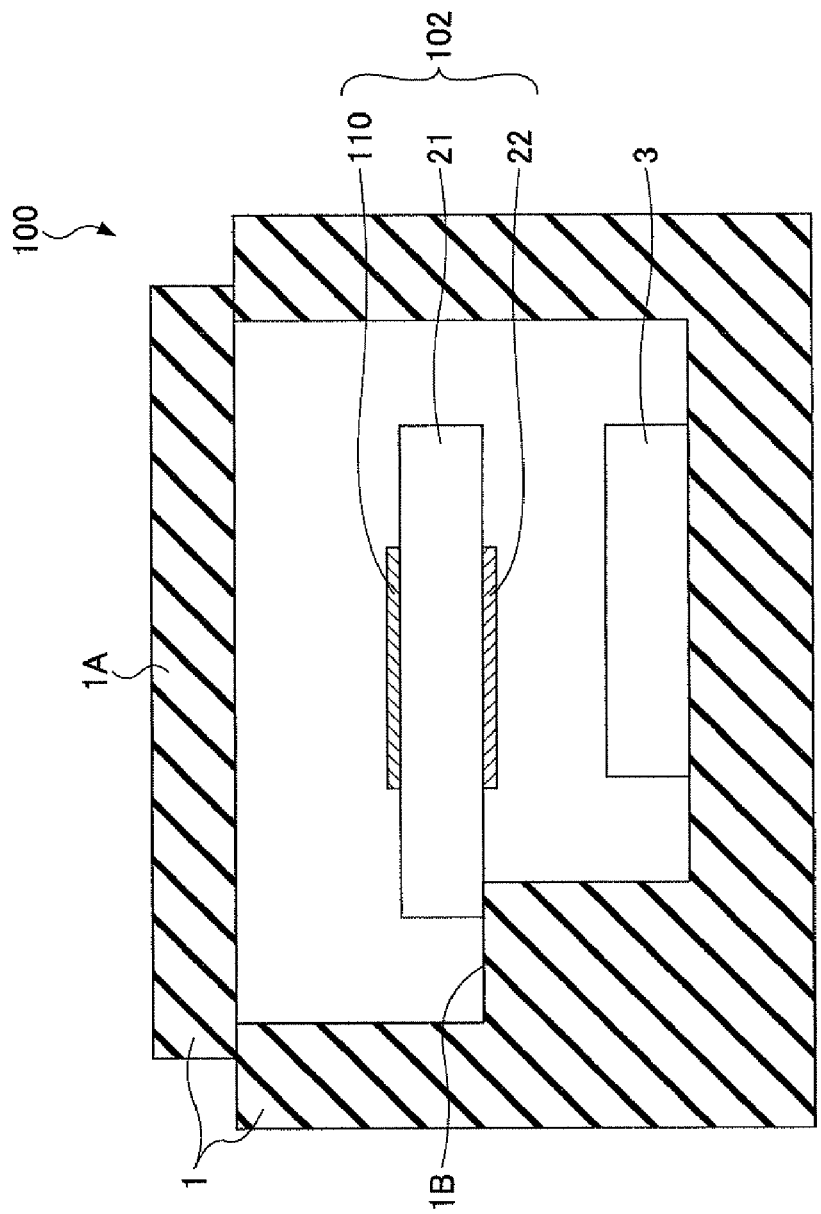
FIG. 3 is a cross-sectional view of a structure of a temperature compensated crystal oscillator according to a first embodiment of the present invention.

FIG. 3 is a cross-sectional view of a structure of a temperature compensated crystal oscillator 100 according to a first embodiment of the present invention.

Figure 1:
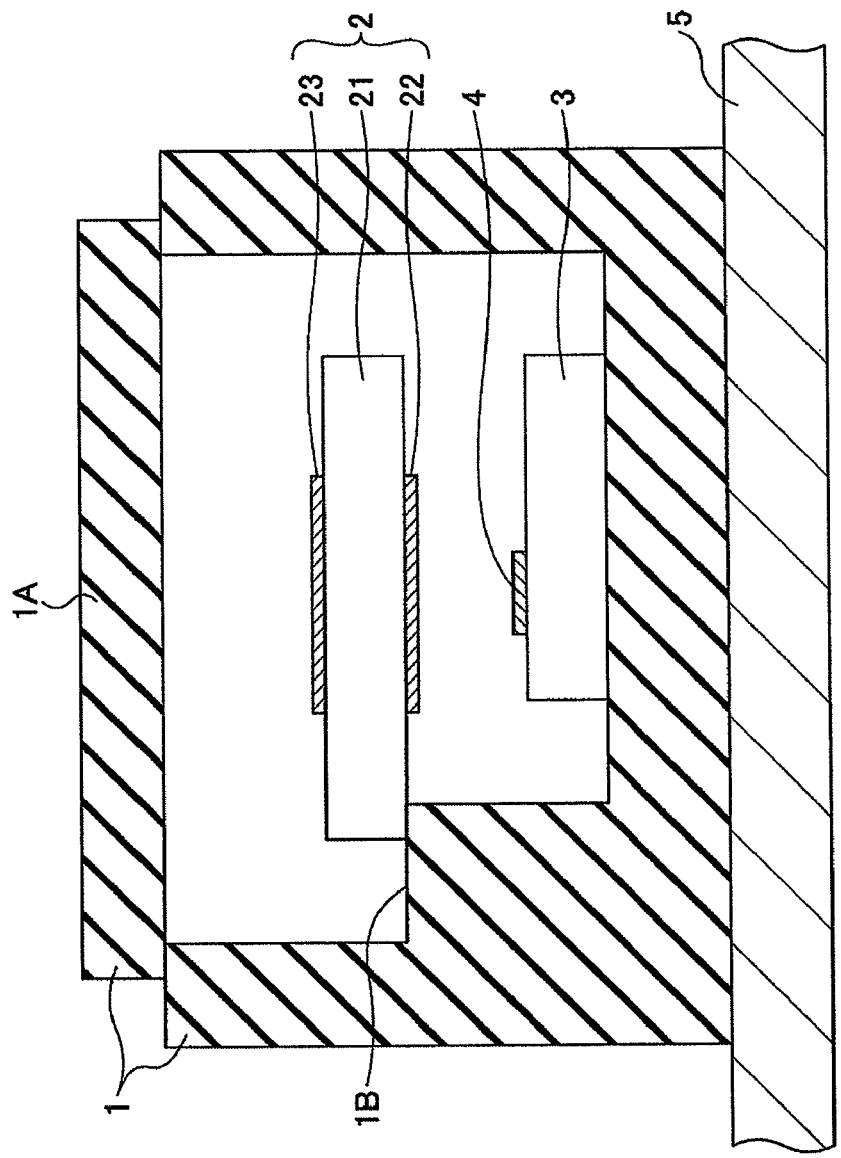
FIG. 1 is a cross-sectional view of a structure of a conventional temperature compensated crystal oscillator.
Figure 2:
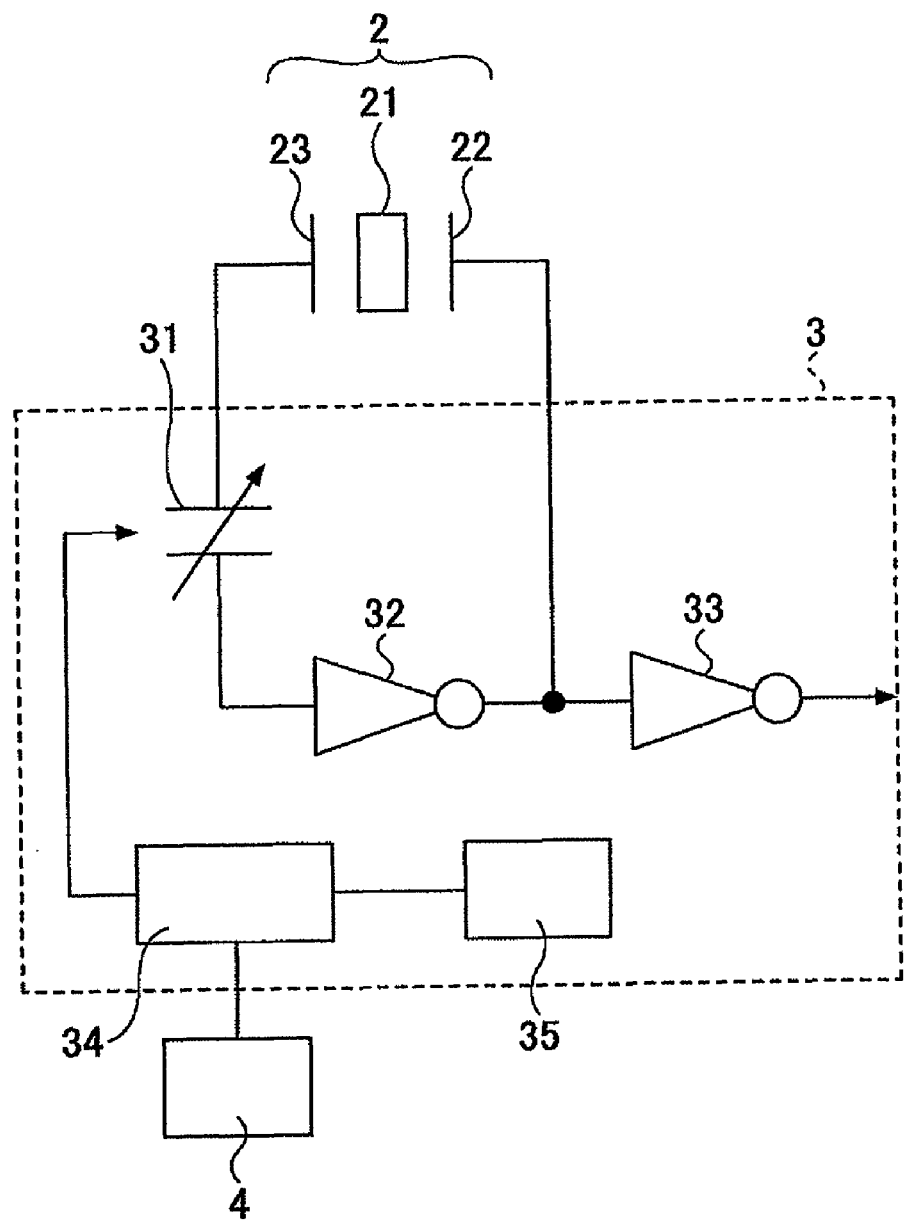
FIG. 2 illustrates a circuit of the conventional temperature compensated crystal oscillator illustrated in FIG. 1.

In FIG. 3, elements corresponding to those of the conventional temperature compensated crystal oscillator of FIG. 1 are denoted by the same reference numerals, and are not further described.

The temperature compensated crystal oscillator 100 according to the first embodiment includes the casing 1 and a crystal oscillator 102 and the IC (Integrated Circuit) 3 that are disposed inside the casing 1. The crystal oscillator 102 includes the crystal piece 21, the excitation electrode 22, and a dual purpose electrode 110.

The dual purpose electrode 110 serves as a temperature sensor (thermosensitive circuit element) and one of the excitation electrodes of the crystal oscillator 102. In the present embodiment, the dual purpose electrode 110 is formed by applying a thin film of nichrome (Ni—Cr: alloy including nickel and chrome) on the surface of the crystal piece 21. The dual purpose electrode 110 may be formed on the surface of the crystal piece 21 by vapor deposition or sputtering.

As described above, the dual purpose electrode 110 corresponds to one of the excitation electrodes of the crystal oscillator 102. Therefore, the dual purpose electrode 110 is to be configured so as not to affect the unique oscillation frequency of the crystal oscillator 102. For this reason, it is preferable that the dual purpose electrode 110 has appropriate mass and is disposed near the center of the crystal piece 21.

In the present embodiment, the other excitation electrode 22, which is the counterpart of the dual purpose electrode 110, is made of a gold thin film. However, the material of the excitation electrode 22 is not limited to gold; the excitation electrode 22 may be made of, for example, silver (Ag) or aluminum (Al).

The cutting azimuth and the size of the AT-cut crystal piece 21 are defined such that the crystal piece 21 oscillates at a predetermined unique oscillation frequency. In the present embodiment, the crystal piece 21 has a length of 3.2 mm (in a horizontal direction as viewed in FIG. 3), a width of 2.5 mm (in a direction piercing through the sheet on which FIG. 3 is illustrated), and a thickness of 1 mm. For example, the dual purpose electrode 110 is a nichrome thin film having a thickness of 0.1 µm.

The space between the bottom surface (on the side closer to the circuit board) of the crystal piece 21 and the top surface of the IC 3 (surface facing the bottom surface of the crystal piece 21) is approximately 0.3 mm. However, these values are merely examples; the size of the crystal piece 21 and the space between the bottom surface of the crystal piece 21 and the top surface of the IC 3 may be set according to the oscillation frequency and other design matters.

Figure 4A:
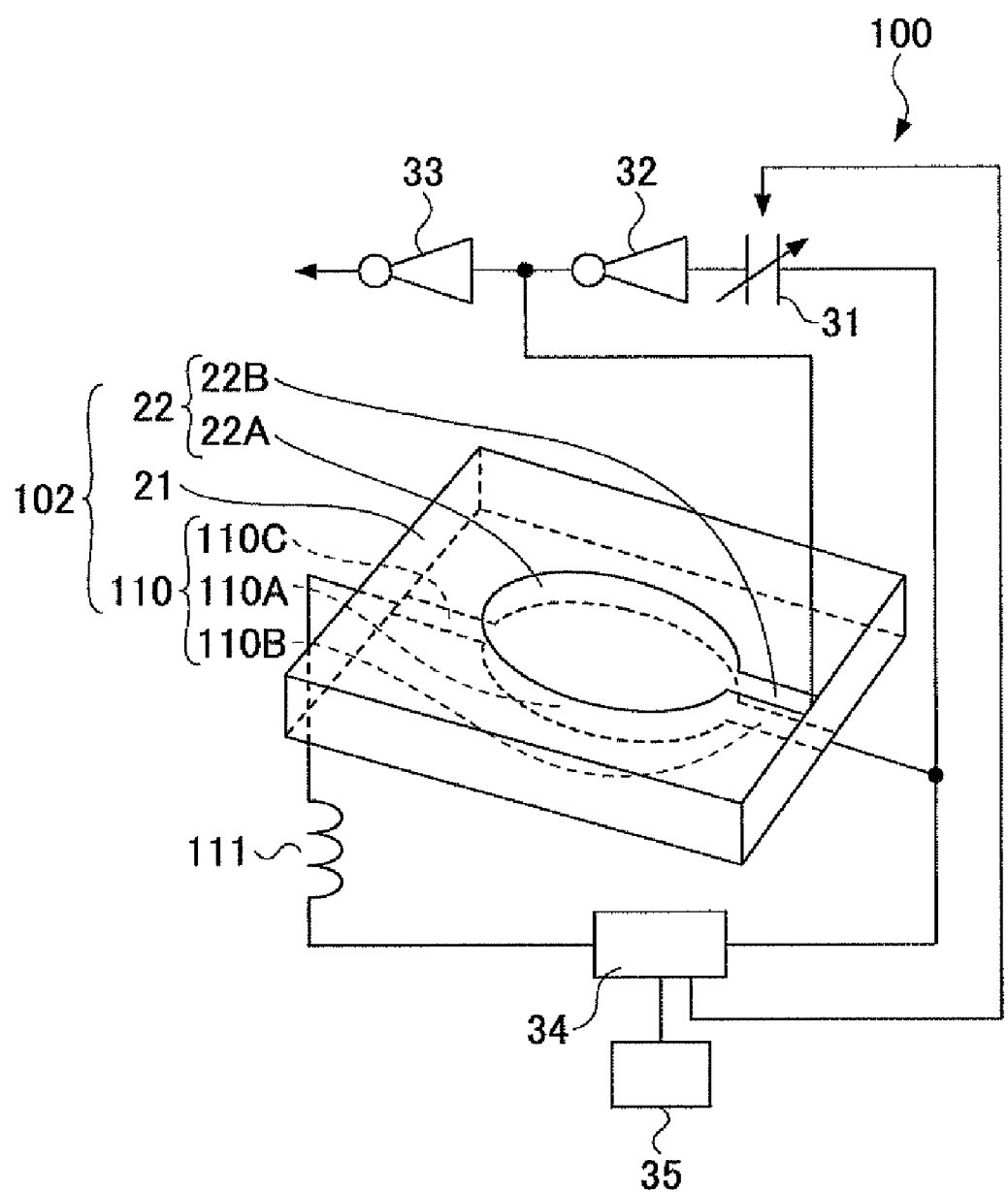
FIGS. 4A and 4B illustrate a circuit of the temperature compensated crystal oscillator according to the first embodiment.
Figure 4B:
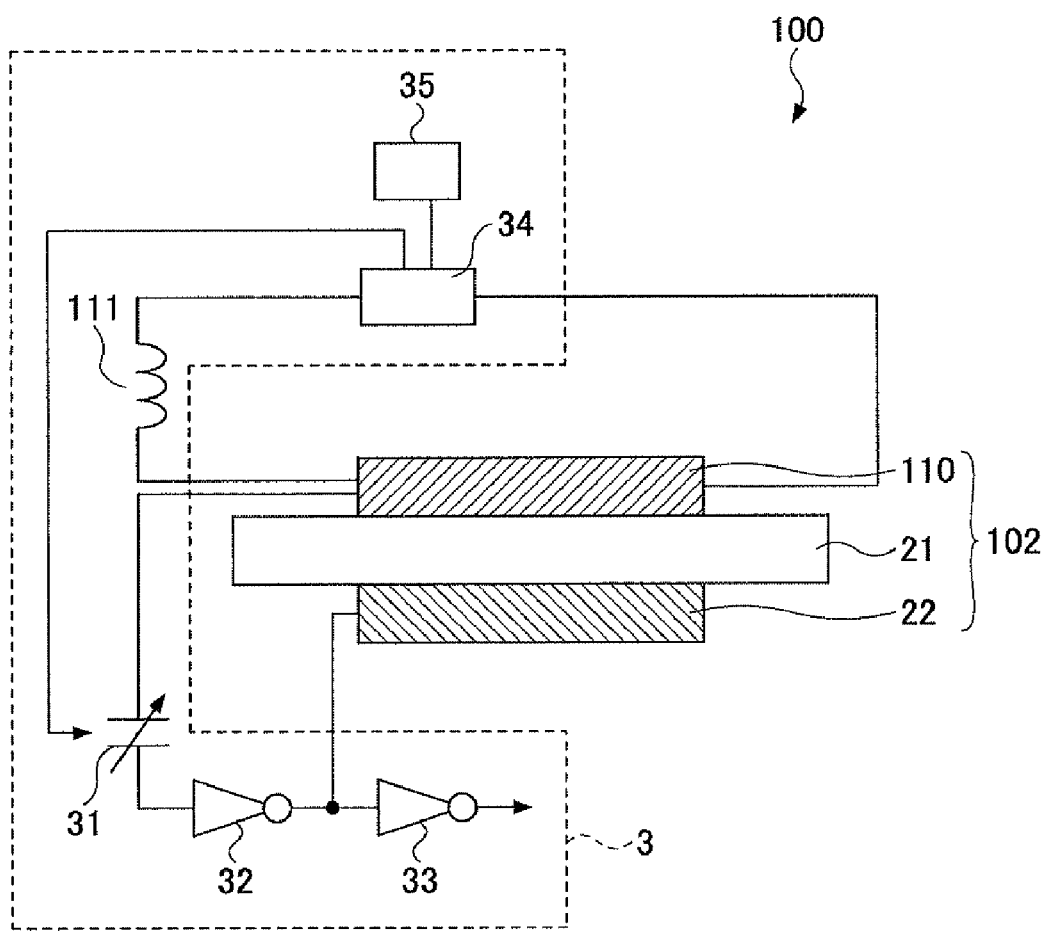
Figure 5:
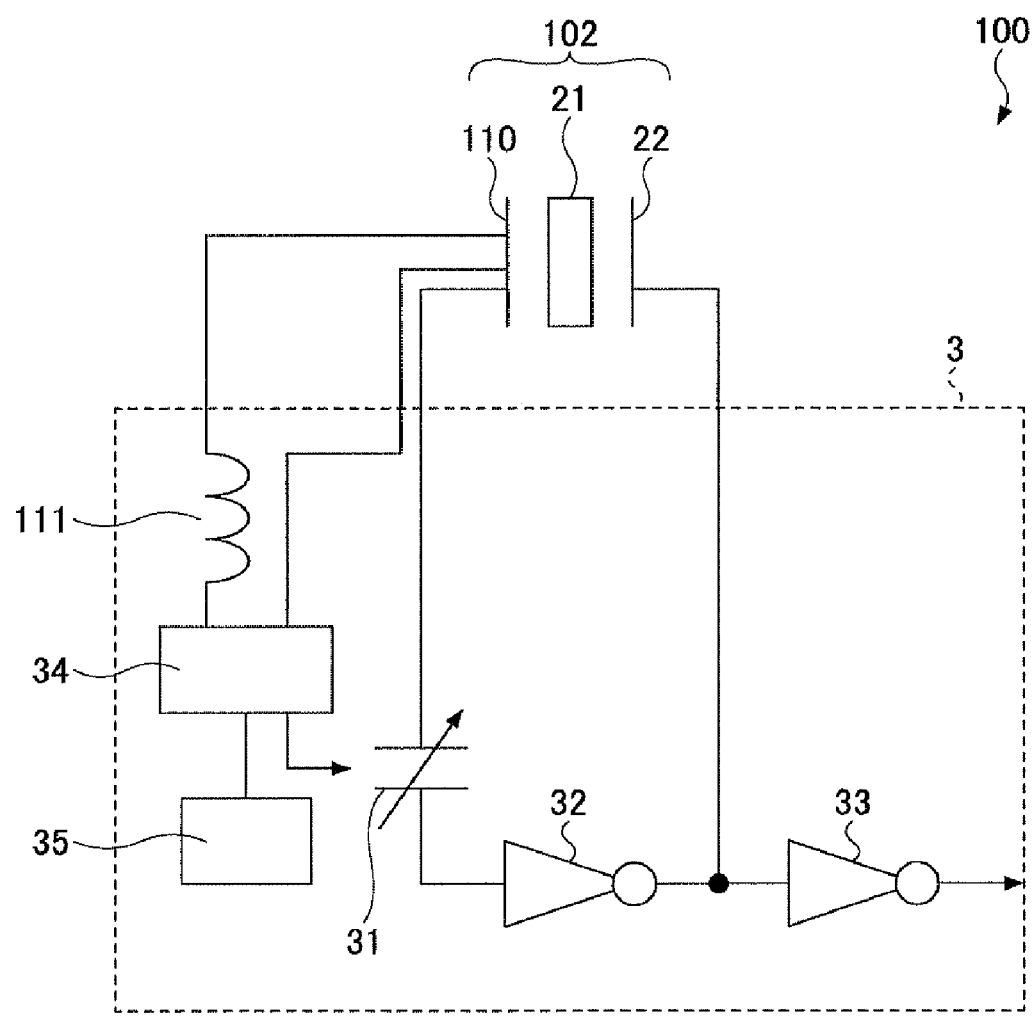
FIG. 5 illustrates a circuit of the temperature compensated crystal oscillator according to the first embodiment.

FIGS. 4A through 5 illustrate a circuit of the temperature compensated crystal oscillator 100 according to the first embodiment.

FIG. 4A illustrates a perspective view of the crystal piece 21, the excitation electrode 22, and the dual purpose electrode 110. FIG. 4B illustrates a cross-sectional view of the crystal piece 21, the excitation electrode 22, and the dual purpose electrode 110. FIG. 5 illustrates the excitation electrode 22 and the dual purpose electrode 110 with circuit symbols.

As a matter of convenience, the crystal piece 21 in FIG. 4A is illustrated upside-down with respect to the crystal piece 21 in FIGS. 3 and 4B. The top surface of the crystal piece 21 as viewed in FIG. 4A is actually the bottom surface of the crystal piece 21, and the bottom surface of the crystal piece 21 as viewed in FIG. 4A is actually the top surface of the crystal piece 21.

As illustrated in FIG. 4A, the excitation electrode 22 is disposed on the bottom surface of the plate-like crystal piece 21, and the dual purpose electrode 110 is disposed on the top surface of the plate-like crystal piece 21.

The excitation electrode 22 is disposed substantially at the center of the bottom surface of the crystal piece 21. The excitation electrode 22 includes an electrode part 22A having an oval shape as viewed from the top, connected to a stripe-like extension part 22B extending along the long axis of the electrode part 22A.

The dual purpose electrode 110 is disposed substantially at the center (i.e., at a position corresponding to the excitation electrode 22) of the top surface of the crystal piece 21. The dual purpose electrode 110 includes an electrode part 110A having an oval shape as viewed from the top, which is connected to two stripe-like extension parts 110B and 110C extending along the long axis of the electrode part 110A.

The extension parts 110B and 110C of the dual purpose electrode 110 are connected to the correction circuit 34 via a coil 111 used for blocking alternate currents. Accordingly, a closed circuit used for temperature detection is formed.

The extension part 110B of the dual purpose electrode 110 is connected to the input terminal of the variable capacitor 31. The extension part 22B of the excitation electrode 22 is connected to the output terminal of the inverter 32. The dual purpose electrode 110 is a counterpart of the excitation electrode 22, serving as one of the excitation electrodes, so that an excitation current is provided from the inverter 32 to the crystal piece 21.

A loop-type oscillation circuit is formed by the variable capacitor 31, the inverter 32, and the crystal oscillator 102.

The output buffer circuit 33 is connected to the output side of the inverter 32. The output buffer circuit 33 is for converting oscillation signals obtained by the oscillation circuit into clock signals, and outputting the clock signals outside of the temperature compensated crystal oscillator 100. The memory 35 is connected to the correction circuit 34. The memory 35 is for storing data expressing inverse properties of the frequency temperature properties of the crystal oscillator 102. The correction circuit 34 detects, via the coil 111, direct current components of the current flowing through the variable capacitor 31. Then, the correction circuit 34 refers to the memory 35 and applies, to the variable capacitor 31, a voltage corresponding to the direct current value of the dual purpose electrode 110.

When an excitation current is supplied from the inverter 32 to the excitation electrode 22 and the dual purpose electrode 110, the crystal piece 21 of the crystal oscillator 102 oscillates, and oscillation signals are obtained by the oscillation circuit. The oscillation signals are output as clock signals via the output buffer circuit 33.

The variable capacitor 31 is a variable capacitance element whose electrostatic capacitance is variable. The variable capacitor 31 is provided so that the electrostatic capacitance of the loop-type oscillation circuit including the crystal oscillator 102 may be varied.

For example, the variable capacitor 31 is formed with a variable diode such as a varicap diode.

The oscillation frequency of the oscillation circuit is adjusted by changing the voltage applied to the variable capacitor 31 in accordance with the temperature change of the crystal piece 21 detected by the dual purpose electrode 110. The memory 35 is built in the IC 3, and stores data expressing the inverse properties of the frequency temperature properties of the crystal oscillator 2. The memory 35 is used by the correction circuit 34 for converting the direct current values of the dual purpose electrode 110 into voltage values applied to the variable capacitor 31. The correction circuit 34 refers to the memory 35, and applies, to the variable capacitor 31, a voltage corresponding to the direct current value of the dual purpose electrode 110.

According to the configuration described above, when the temperature detected by the dual purpose electrode 110 changes, a temperature signal expressing the temperature change is input to the correction circuit 34, the correction circuit 34 refers to data expressing inverse properties of the frequency temperature properties stored in the memory 35, and applies a corresponding voltage to the variable capacitor 31. As a result, the oscillation frequency of the oscillation circuit is corrected, so that the output frequency is stabilized with respect to temperature changes.

In FIGS. 4B and 5, the extension part 22B of the excitation electrode 22 and the extension parts 110B and 110C of the dual purpose electrode 110 are not illustrated as a matter of convenience. In FIG. 4B, the scale sizes of the excitation electrode 22 and the dual purpose electrode 110 are increased in the thickness direction with respect to the crystal piece 21.

As illustrated in FIGS. 4B and 5, the dual purpose electrode 110 is a counterpart of the excitation electrode 22, serving as one of the excitation electrodes. Thus, the crystal piece 21 oscillates when driving power is supplied to the inverter 32 and an excitation current flows inside the crystal piece 21 via the dual purpose electrode 110 and the excitation electrode 22.

When the temperature detected by the dual purpose electrode 110 changes, a temperature signal expressing the temperature change is input to the correction circuit 34. The correction circuit 34 refers to data expressing inverse properties of the frequency temperature properties stored in the memory 35, and outputs a voltage corresponding to the temperature signal. According to the applied voltage output from the correction circuit 34, the electrostatic capacitance of the variable capacitor 31 changes. As a result, the oscillation frequency of the crystal oscillator 102 is adjusted, so that the oscillation frequency of the oscillation circuit is stabilized with respect to temperature changes.

The temperature compensated crystal oscillator 100 according to the first embodiment includes the dual purpose electrode 110 made of a metal thin film formed on the surface of the crystal piece 21. The dual purpose electrode 110 serves as a thermosensitive circuit element and as one of the excitation electrodes. Therefore, even if the temperature of the crystal piece 21 changes, the crystal piece 21 oscillates at a stabilized oscillation frequency.

As described above, the temperature compensated crystal oscillator 100 according to the first embodiment uses the dual purpose electrode 110 disposed on the crystal piece 21 to correct the oscillation frequency in accordance with temperature changes of the crystal piece 21. Therefore, the temperature compensated crystal oscillator 100 is capable of quickly responding to rapid temperature increases. Hence, the temperature compensated crystal oscillator 100 is capable of outputting clock signals in a stabilized manner, even when the temperature compensated crystal oscillator 100 is disposed near an electron element such as a power amplifier or a transmission unit whose temperature rises rapidly.

Figure 6A:
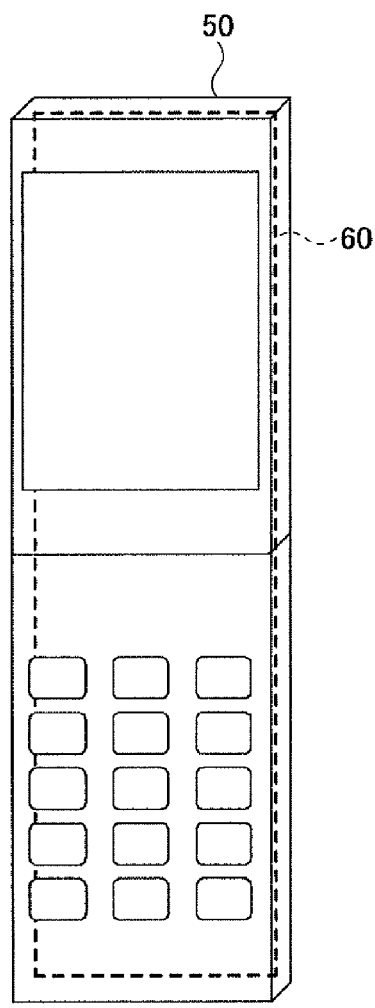
FIG. 6A illustrates a mobile phone including the temperature compensated crystal oscillator according to the first embodiment.
Figure 6B:
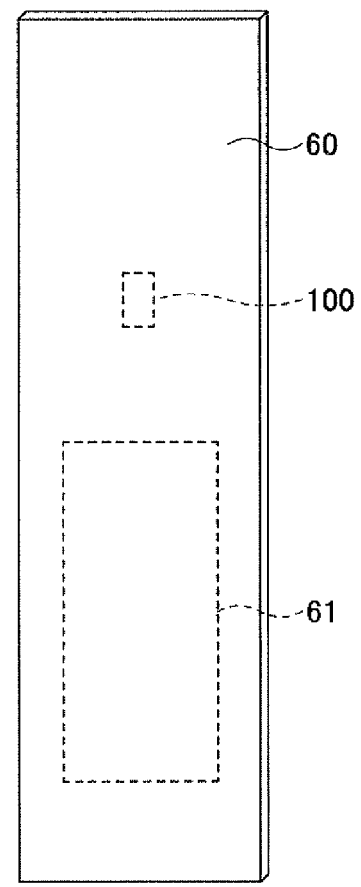
FIG. 6B illustrates a printed-circuit board on which the temperature compensated crystal oscillator according to the first embodiment is mounted.

FIG. 6A illustrates a mobile phone including the temperature compensated crystal oscillator 100 according to the first embodiment, and FIG. 6B illustrates a printed-circuit board on which the temperature compensated crystal oscillator 100 according to the first embodiment is mounted.

FIG. 6A illustrates a mobile phone 50 with the installed temperature compensated crystal oscillator 100. The mobile phone 50 includes a printed-circuit board 60 on which elements such as a communications circuit are mounted. On the printed-circuit board 60, a communications circuit 61 and the temperature compensated crystal oscillator 100 are mounted.

The mobile phone 50 is a typical example of a device having a limited amount of internal space, due to the miniaturization of electronic devices. Thus, the temperature compensated crystal oscillator 100 may be disposed near the heat source. A typical example of a heat source is a power amplifier. When the mobile phone 50 is not performing communications, the power amplifier does not emit much heat. However, when communications start, the temperature rises rapidly, and therefore heat is suddenly transferred to the temperature compensated crystal oscillator 100. As a result, the temperature of the temperature compensated crystal oscillator 100 may rise rapidly.

However, even in cases where the temperature rises rapidly, the temperature compensated crystal oscillator 100 according to the first embodiment is capable of accurately compensating for variations in the oscillation frequency.

It is preferable that the reference clock signals used by the mobile phone 50 or a GPS (Global Positioning System) terminal are highly precise. In this respect, it is very effective to use the temperature compensated crystal oscillator 100 according to the present embodiment.

FIGS. 6A and 6B illustrate the mobile phone 50 as an example of an electronic device equipped with the temperature compensated crystal oscillator 100; however, an electronic device equipped with the temperature compensated crystal oscillator 100 is not limited to the mobile phone 50.

[b] Second Embodiment

Figure 7:
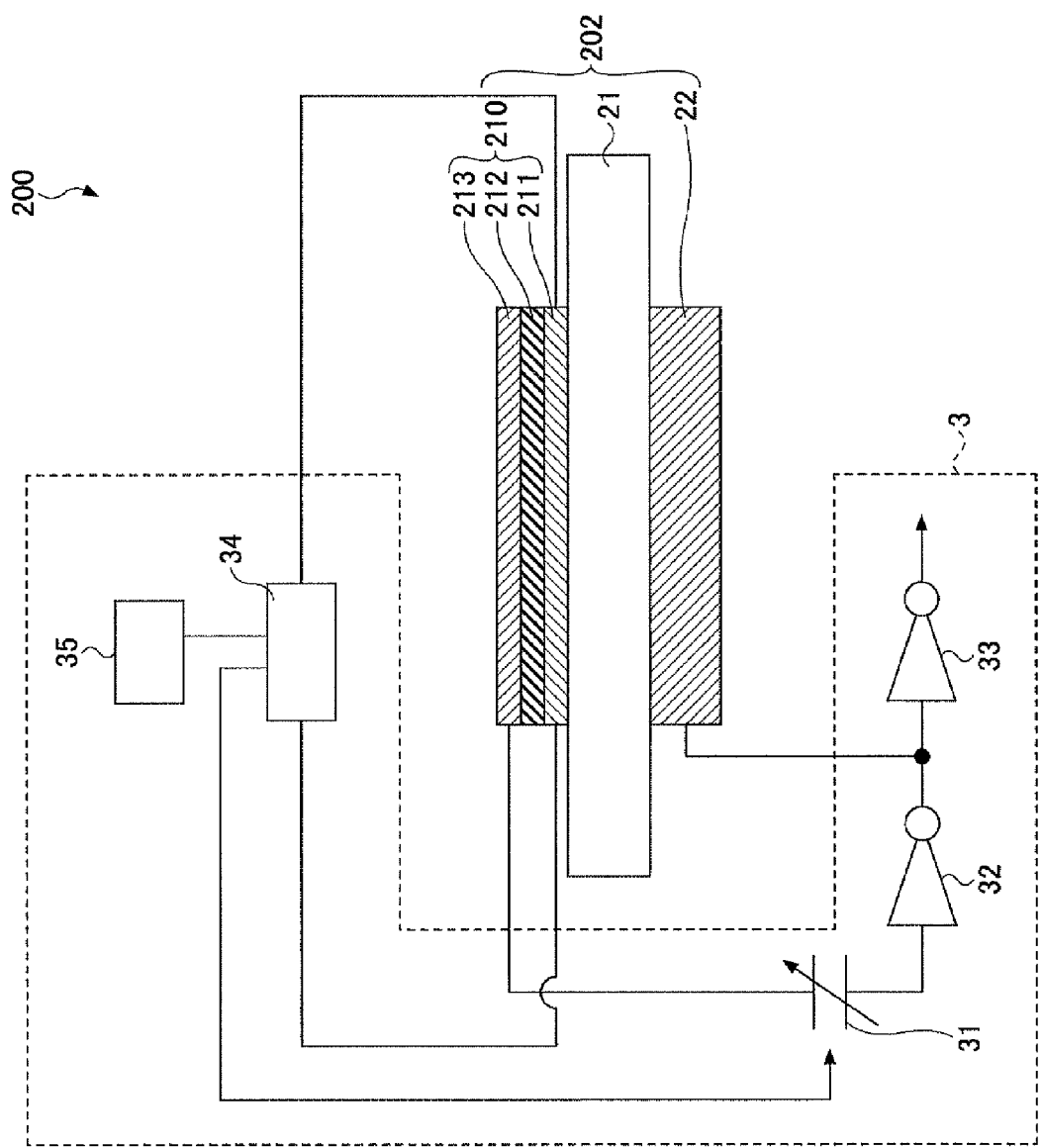
FIG. 7 illustrates a circuit of a temperature compensated crystal oscillator according to a second embodiment of the present invention.
Figure 8:
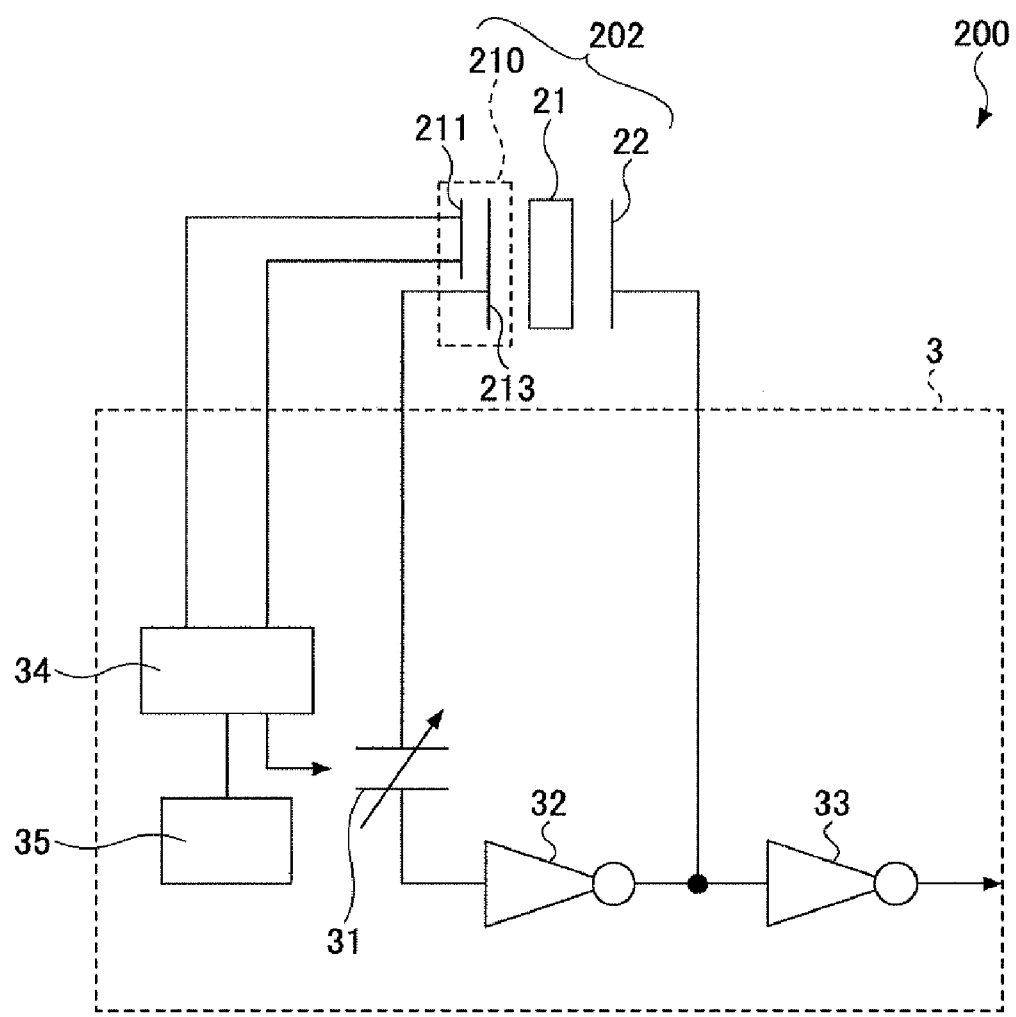
FIG. 8 illustrates a circuit of the temperature compensated crystal oscillator according to the second embodiment of the present invention.

FIGS. 7 and 8 illustrate a circuit of a temperature compensated crystal oscillator 200 according to a second embodiment of the present invention.

A crystal oscillator 202 of the temperature compensated crystal oscillator 200 according to the second embodiment includes the crystal piece 21, the excitation electrode 22, and a laminated electrode 210. The structure of the thermosensitive circuit element of the second embodiment is different from that of the first embodiment.

FIG. 7 illustrates a cross-sectional view of the crystal piece 21, the excitation electrode 22, and the laminated electrode 210. FIG. 8 illustrates the excitation electrode 22 and the laminated electrode 210 with circuit symbols.

In FIG. 7, a detecting electrode 211 may be any thermosensitive circuit element for detecting the temperature of the crystal piece 21. One example of the detecting electrode 211 is a nichrome thin film. An insulating layer 212 may be any thin film layer for electrically insulating the detecting electrode 211 from an excitation electrode 213. One example of the insulating layer 212 is a silicon oxide layer. The excitation electrode 213 may be any thin film electrode for supplying an excitation current to the crystal piece 21, serving as a counterpart of the excitation electrode 22. One example of the excitation electrode 213 is a thin film made of gold (Au). Furthermore, the excitation electrode 22 may be a thin film electrode made of gold (Au).

The laminated electrode 210 is fabricated by laminating the detecting electrode 211 (nichrome thin film), the insulating layer 212 (silicon oxide layer), and the excitation electrode 213 (gold thin film) on the surface of the crystal piece 21 by vapor deposition or sputtering.

The material and the fabrication method of the detecting electrode 211, the insulating layer 212, and the excitation electrode 213 are not limited to those mentioned above.

The detecting electrode 211 is connected to the correction circuit 34 to form a closed circuit used for temperature detection. The correction circuit 34 detects the temperature of the crystal piece 21 by applying a voltage to the detecting electrode 211, and detecting a current (temperature signal) corresponding to the temperature from the detecting electrode 211. The detected temperature signal is used for controlling the operation of correcting the oscillation frequency.

The excitation electrode 213 of the laminated electrode 210 is connected to the input terminal of the variable capacitor 31. The excitation electrode 22 is connected to the output terminal of the inverter 32. The excitation electrode 213 of the laminated electrode 210 is a counterpart of the excitation electrode 22, serving as one of the excitation electrodes, so that an excitation current is provided to the crystal piece 21.

A loop-type oscillation circuit is formed by the variable capacitor 31 and the inverter 32, for obtaining oscillation signals based on the oscillation of the crystal oscillator 202. The oscillation frequency of the oscillation signals is determined by the unique oscillation frequency of the crystal oscillator 202.

The output buffer circuit 33 is connected to the output side of the inverter 32. The output buffer circuit 33 is for converting oscillation signals obtained by the oscillation circuit into clock signals, and outputting the clock signals outside of the temperature compensated crystal oscillator 200. The memory 35 is connected to the correction circuit 34. The memory 35 is for storing data expressing inverse properties of the frequency temperature properties of the crystal oscillator 202.

As described above, the detecting electrode 211 and the excitation electrode 213 are insulated by the insulating layer 212. The closed circuit for detecting temperature and the oscillation circuit are electrically insulated/separated. Therefore, there is no need for a coil used for blocking alternate currents like the first embodiment.

Similar to the first embodiment, the laminated electrode 210 has appropriate mass and is disposed at a particular position, so that the unique oscillation frequency of the crystal piece 21 is unaffected.

The laminated electrode 210 and the excitation electrode 22 of the temperature compensated crystal oscillator 200 having the above configuration are indicated as circuit signals in FIG. 8. In the laminated electrode 210, the detecting electrode 211 and the excitation electrode 213 are insulated/separated. Therefore, the closed circuit for detecting temperature, which includes the correction circuit 34, and the oscillation circuit, which includes the variable capacitor 31 and the inverter 32, are electrically insulated.

When the correction circuit 34 applies a voltage to the detecting electrode 211 of the laminated electrode 210, a temperature signal (current value) is input to the correction circuit 34. Specifically, the temperature signal (current value) expresses the temperature of the crystal piece 21 detected by the detecting electrode 211. The correction circuit 34 refers to the data in the memory 35, and outputs a voltage (compensation voltage). Specifically, the voltage (compensation voltage) is a value corresponding to the temperature signal expressing the temperature of the crystal piece 21 that is input from the detecting electrode 211. The compensation voltage output from the correction circuit 34 is set to correct the electrostatic capacitance of the variable capacitor 31 so as to cancel out (compensate for) the variation in the oscillation frequency caused by temperature changes of the crystal piece 21. This compensation voltage is supplied to the variable capacitor 31. Thus, the electrostatic capacitance of the variable capacitor 31 is controlled.

Accordingly, when there is a change in the temperature detected by the detecting electrode 211 of the laminated electrode 210, a temperature signal expressing the temperature change is input to the correction circuit 34. The correction circuit 34 outputs a compensation voltage according to the temperature signal, so that the electrostatic capacitance of the variable capacitor 31 is adjusted, and the oscillation frequency of the crystal oscillator 202 is stabilized with respect to temperature changes.

That is to say, feedback control is performed on the electrostatic capacitance of the variable capacitor 31, based on the temperature signal output from the detecting electrode 211 of the laminated electrode 210. Thus, even if the temperature of the environment changes, variations in the oscillation frequency of the crystal oscillator 202 are compensated so that the oscillation frequency is stabilized. Accordingly, the frequency of clock signals output from the output buffer circuit 33 is maintained within a predetermined range.

According to the second embodiment, the laminated electrode 210, which is formed by laminating the detecting electrode 211 and the excitation electrode 213, is formed on the surface of the crystal piece 21. Therefore, the crystal oscillator 202 is oscillated without affecting the unique oscillation frequency of the crystal piece 21.

Furthermore, the temperature of the crystal piece 21 is detected with the use of the detecting electrode 211 of the laminated electrode 210 formed on the surface of the crystal piece 21. This configuration prevents a delay in the heat transfer, which occurs in the conventional technology. That is to say, the detecting electrode 211 detects a temperature signal (current value expressing temperature) that correctly expresses the temperature of the crystal piece 21.

Accordingly, the temperature compensated crystal oscillator 200 according to the second embodiment is capable of correctly controlling the electrostatic capacitance of the variable capacitor 31 based on a temperature signal that is correctly detected by the laminated electrode 210, so that variations in the oscillation frequency of the oscillation signals are correctly and stably compensated.

As described above, the temperature compensated crystal oscillator 200 according to the second embodiment is capable of quickly responding to rapid temperature rises with the use of the laminated electrode 210 disposed on the crystal piece 21. Therefore, the temperature compensated crystal oscillator 200 is capable of outputting clock signals correctly and stably, even if the temperature compensated crystal oscillator 200 is disposed near an electron element such as a power amplifier whose temperature rises rapidly.

Thus, the oscillation frequency is compensated with high precision, even if the temperature compensated crystal oscillator 200 is installed in a highly-densified electronic device that has limited freedom in design, such as a mobile phone or a car navigation system.

[c] Third Embodiment

Figure 9:
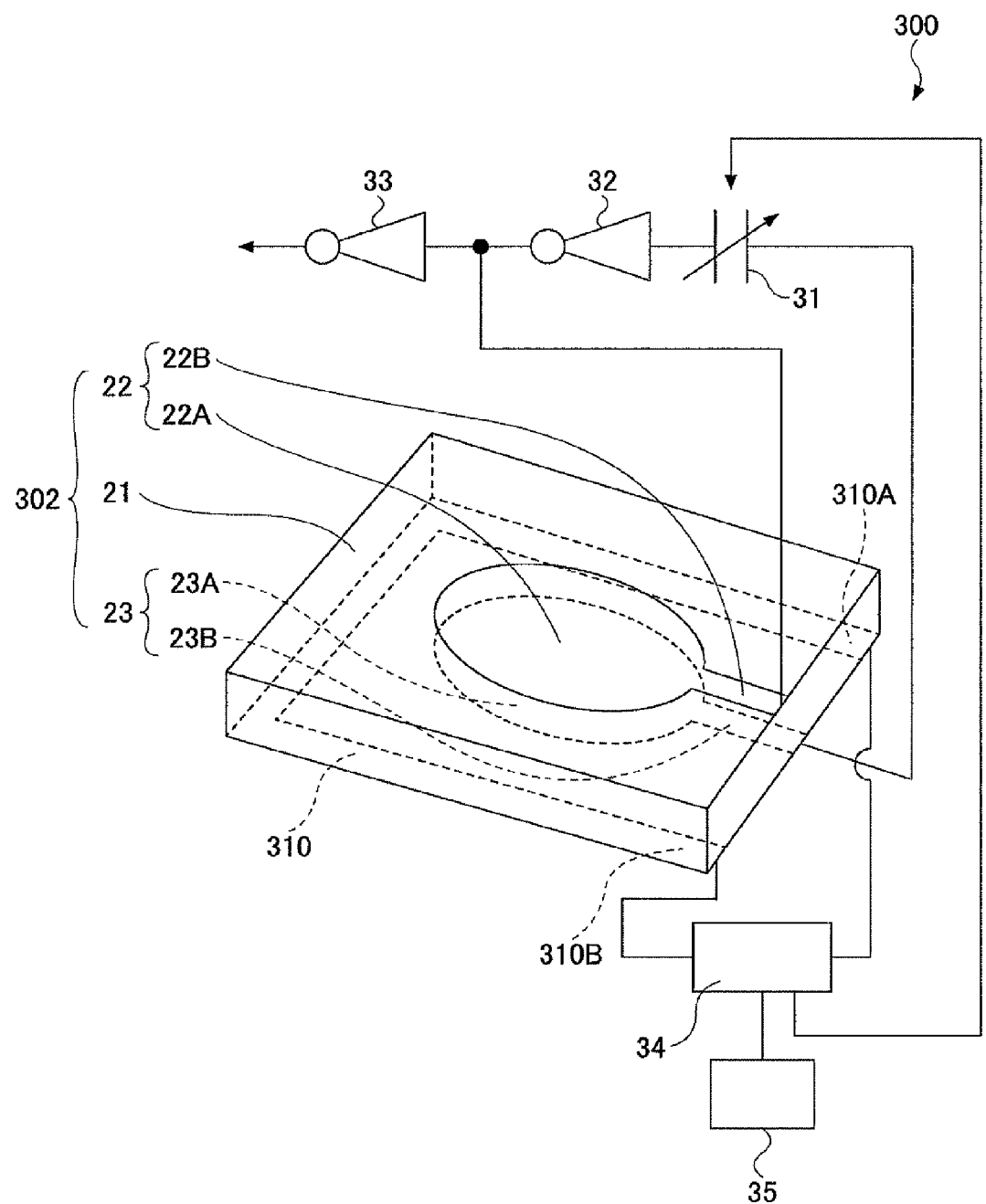
FIG. 9 illustrates a circuit of a temperature compensated crystal oscillator according to a third embodiment of the present invention.
Figure 10:
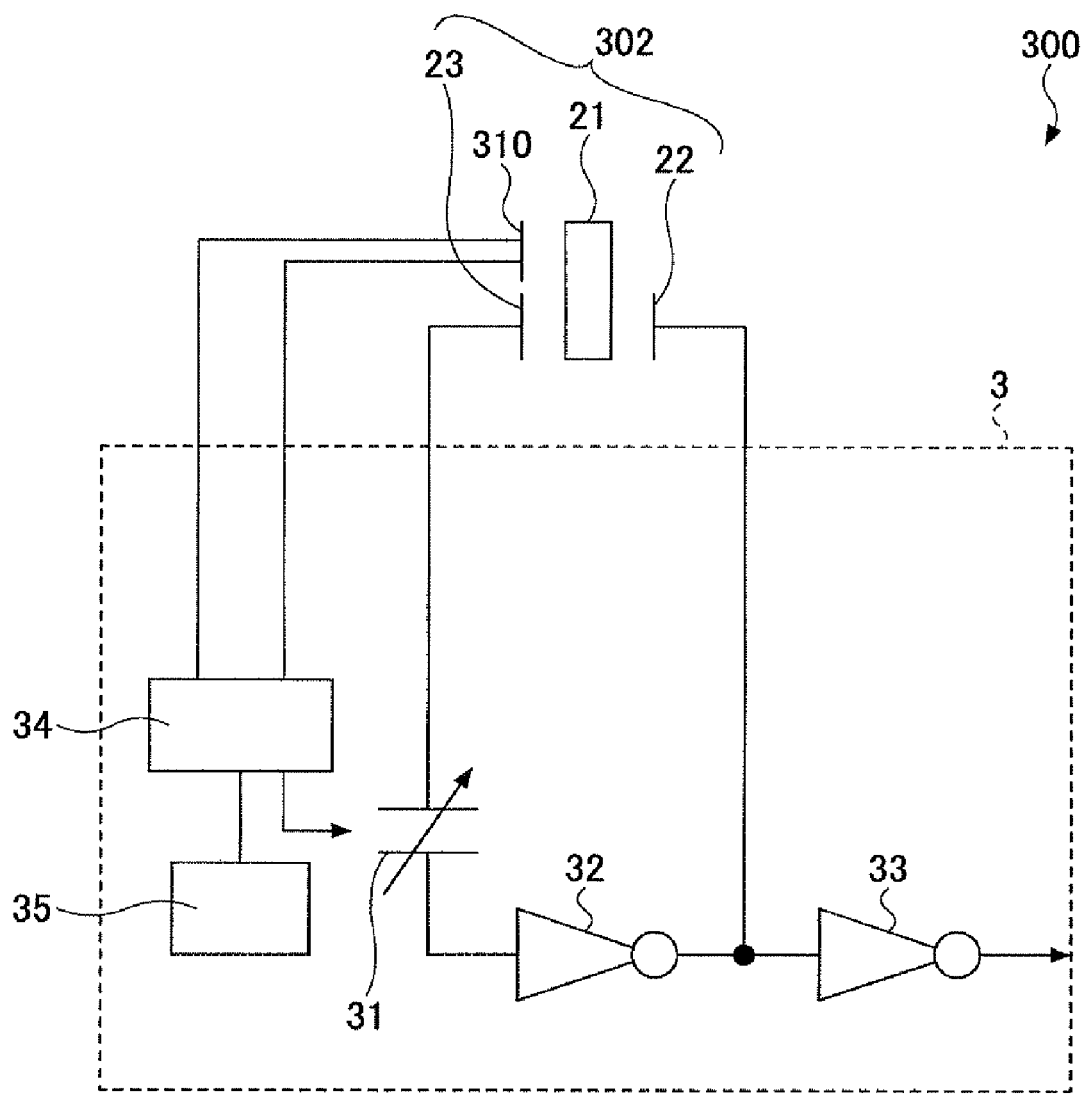
FIG. 10 illustrates a circuit of the temperature compensated crystal oscillator according to the third embodiment of the present invention.

FIGS. 9 and 10 illustrate a circuit of a temperature compensated crystal oscillator 300 according to a third embodiment of the present invention.

A crystal oscillator 302 of the temperature compensated crystal oscillator 300 according to the third embodiment includes the crystal piece 21, the excitation electrodes 22, 23, and a temperature sensor 310. The structure of the thermosensitive circuit element (temperature sensor 310) included in the crystal oscillator 302 of the third embodiment is different from that of the first embodiment.

FIG. 9 illustrates a perspective view of the crystal piece 21, the excitation electrodes 22, 23, and the temperature sensor 310. FIG. 10 illustrates the crystal piece 21, the excitation electrodes 22, 23, and the temperature sensor 310 with circuit symbols.

The temperature compensated crystal oscillator 300 according to the third embodiment is different from the first embodiment in the following respect. That is, the two excitation electrodes 22, 23 are disposed on the crystal piece 21. Furthermore, the temperature sensor 310 serving as the thermosensitive circuit element for detecting the temperature of the crystal piece 21 is disposed on the crystal piece 21, on the side with the excitation electrode 23.

The excitation electrode 22 is disposed substantially at the center of the bottom surface of the crystal piece 21. The excitation electrode 22 includes the electrode part 22A having an oval shape as viewed from the top connected to the stripe-like extension part 22B.

The excitation electrode 23 is disposed substantially at the center of the top surface of the crystal piece 21. The excitation electrode 23 includes an electrode part 23A having an oval shape as viewed from the top connected to a stripe-like extension part 23B.

The excitation electrodes 22, 23 have the same structure. A thin film electrode made of gold (Au) may be used as the excitation electrodes 22, 23.

The temperature sensor 310 is a temperature sensor that is disposed on the top surface of the crystal piece 21 (i.e., the surface with the excitation electrode 23), in such a manner to be spaced away and insulated/separated from the excitation electrode 23. The temperature sensor 310 has a U-shape as viewed from the top, formed along the edges of the top surface of the crystal piece 21.

The temperature sensor 310 may be any thermosensitive circuit element for detecting the temperature of the crystal piece 21. One example of the temperature sensor 310 is a nichrome thin film. The nichrome thin film may be fabricated by vapor deposition or sputtering. The material and the fabrication method of the temperature sensor 310 are not limited to those mentioned above. Any other material or fabrication method may be used.

In FIG. 9, the temperature sensor 310 has a U-shape as viewed from the top, formed along the edges of the top surface of the crystal piece 21 (i.e., the surface with the excitation electrode 23). However, the temperature sensor 310 is not limited to having a U-shape as viewed from the top; the temperature sensor 310 may have another shape. The temperature sensor 310 is not limited to the position as illustrated in FIG. 9; the temperature sensor 310 may be located at another position on the surface of the crystal piece 21. However, the unique oscillation frequency of the crystal piece 21 is not to be affected. Therefore, the mass and the position of the temperature sensor 310 are to be determined so as not to affect the unique oscillation frequency, in consideration of the positional relationship with the excitation electrodes 22, 23.

The extension part 22B of the excitation electrode 22 is connected to the output terminal of the inverter 32. The extension part 23B of the excitation electrode 23 is connected to the input terminal of the variable capacitor 31. Accordingly, the two excitation electrodes 22, 23 supply the excitation current to the crystal piece 21.

The variable capacitor 31 and the inverter 32 form a loop-type oscillation circuit for obtaining oscillation signals based on the oscillation of the crystal oscillator 302. The oscillation frequency of the oscillation signals is determined based on the unique oscillation frequency of the crystal oscillator 302.

The output buffer circuit 33 is connected to the output side of the inverter 32. The output buffer circuit 33 is for converting oscillation signals obtained by the oscillation circuit into clock signals, and outputting the clock signals outside of the temperature compensated crystal oscillator 300. The memory 35 is connected to the correction circuit 34. The memory 35 is for storing data expressing inverse properties of the frequency temperature properties of the crystal oscillator 103.

As illustrated in FIG. 9, the closed circuit for detecting temperature and the loop-type oscillation circuit are electrically insulated/separated. Therefore, there is no need for a coil used for blocking alternate currents like the first embodiment.

The temperature sensor 310 and the excitation electrodes 22, 23 of the temperature compensated crystal oscillator 200 having the above configuration are indicated as circuit signals in FIG. 10. The excitation electrode 23 and the temperature sensor 310 are insulated/separated. Therefore, the closed circuit for detecting temperature, which includes the correction circuit 34, and the loop-type oscillation circuit, which includes the variable capacitor 31 and the inverter 32, are electrically insulated/separated.

When the correction circuit 34 applies a voltage to the temperature sensor 310, a temperature signal (current value) is input to the correction circuit 34. Specifically, the temperature signal (current value) expresses the temperature of the crystal piece 21 detected by the temperature sensor 310. The correction circuit 34 refers to the data in the memory 35, and outputs a voltage (compensation voltage). Specifically, the voltage (compensation voltage) is a value corresponding to the temperature signal expressing the temperature of the crystal piece 21 that is input from the temperature sensor 310. The compensation voltage output from the correction circuit 34 is set to correct the electrostatic capacitance of the variable capacitor 31 so as to cancel out (compensate for) the variation in the oscillation frequency caused by temperature changes of the crystal piece 21. This compensation voltage is supplied to p-n junction of the variable capacitor 31. Thus, the electrostatic capacitance of the variable capacitor 31 is controlled.

Accordingly, when there is a change in the temperature detected by the temperature sensor 310, a temperature signal expressing the temperature change is input to the correction circuit 34. The correction circuit 34 outputs a compensation voltage according to the temperature signal, so that the electrostatic capacitance of the variable capacitor 31 is adjusted, and the oscillation frequency of the crystal oscillator 302 is stabilized with respect to temperature changes.

That is to say, feedback control is performed on the electrostatic capacitance of the variable capacitor 31, based on the temperature signal output from the temperature sensor 310.

Thus, even if the temperature of the environment changes, variations in the oscillation frequency of the crystal oscillator 302 are compensated so that the oscillation frequency is stabilized. Accordingly, the frequency of clock signals output from the output buffer circuit 33 is maintained within a predetermined range.

According to the third embodiment, the temperature sensor 310 is formed on the surface of the crystal piece 21. The temperature sensor 310 is insulated/separated from the excitation electrodes 22, 23 so as not to affect the unique oscillation frequency of the crystal piece 21. Therefore, the crystal oscillator 302 is oscillated at a predetermined unique oscillation frequency.

Furthermore, the temperature of the crystal piece 21 is detected with the use of the temperature sensor 310 formed on the surface of the crystal piece 21. This configuration prevents a delay in the heat transfer, which occurs in the conventional technology. That is to say, the temperature sensor 310 detects a temperature signal (current value expressing temperature) that correctly expresses the temperature of the crystal piece 21.

Accordingly, the temperature compensated crystal oscillator 300 according to the third embodiment is capable of correctly controlling the electrostatic capacitance of the variable capacitor 31 based on a temperature signal that is correctly detected by the temperature sensor 310, so that variations in the oscillation frequency of the oscillation signals are correctly and stably compensated.

As described above, the temperature compensated crystal oscillator 300 according to the third embodiment is capable of quickly responding to rapid temperature rises with the use of the temperature sensor 310 disposed on the crystal piece 21. Therefore, the temperature compensated crystal oscillator 300 is capable of outputting clock signals correctly and stably, even if the temperature compensated crystal oscillator 300 is disposed near an electron element such as a power amplifier whose temperature rises rapidly.

Thus, the oscillation frequency is compensated with high precision, even if the temperature compensated crystal oscillator 300 is installed in a highly-densified electronic device that has limited freedom in design, such as a mobile phone or a car navigation system.

In the third embodiment, a single temperature sensor 310 is disposed on the crystal piece 21; however, there may be plural temperature sensors 310 disposed on the crystal piece 21.

In the third embodiment, the excitation electrodes 22, 23 have the same structure; however, the excitation electrodes 22, 23 may have different structures to adjust the oscillation frequency of the crystal piece 21. For example, the excitation electrode 23 formed on the side with the temperature sensor 310 may have lighter mass and a smaller area that those of the excitation electrode 22.

According to an aspect of the present invention, the temperature of the crystal oscillator is measured with the use of output from a thermosensitive element that is formed on the crystal oscillator by vapor deposition. Thus, temperature compensation is performed by directly applying the temperature of the crystal oscillator. Accordingly, temperature compensation is performed more accurately compared to the conventional technology in which the temperature is indirectly detected.

The above described temperature compensated crystal oscillator, the printed-circuit board having the temperature compensated crystal oscillator mounted thereon, and the electronic device equipped with the temperature compensated crystal oscillator according to an exemplary embodiment of the present invention are not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A temperature compensated crystal oscillator comprising:
   an oscillation circuit including a crystal oscillator, the crystal oscillator including a crystal piece and excitation electrodes formed on the crystal piece;
   a variable capacitor inserted in series with the crystal oscillator in the oscillation circuit;
   a thermosensitive circuit element whose resistance value changes in accordance with a temperature of the crystal oscillator, the thermosensitive circuit element being formed on the crystal piece of the crystal oscillator by vapor deposition; and
   a correction circuit configured to correct capacitance of the variable capacitor based on a current value that is used when applying current to the thermosensitive circuit element,
   wherein one of the excitation electrodes of the crystal oscillator is laminated to the thermosensitive circuit element via an insulating layer.

2. The temperature compensated crystal oscillator according to claim 1, wherein
   the thermosensitive circuit element is a nichrome thin film.

3. A printed-circuit board on which the temperature compensated crystal oscillator according to claim 1 is mounted.

4. An electronic device equipped with the temperature compensated crystal oscillator according to claim 1.

* * * * *